United States Patent
Hartmann et al.

(10) Patent No.: US 6,268,782 B1
(45) Date of Patent: *Jul. 31, 2001

(54) ELECTRO-ACOUSTIC DEVICE WITH A VARIABLE ACOUSTIC WAVE VELOCITY PIEZOELECTRIC SUBSTRATE

(75) Inventors: Clinton S. Hartmann, Dallas, TX (US); Dong Pei Chen, Nashua, NH (US)

(73) Assignee: Micronas Semiconductor SA, Bevaix (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/741,025

(22) Filed: Oct. 30, 1996

(30) Foreign Application Priority Data

Nov. 3, 1995 (GB) .................................... 9522533

(51) Int. Cl.⁷ .............................. H03H 9/145; H03H 9/64
(52) U.S. Cl. ....................... 333/193; 333/195; 310/313 B
(58) Field of Search ..................... 333/193–196; 310/313 R, 313 B, 313 C, 313 D (56) References Cited

U.S. PATENT DOCUMENTS

| | | | |
|---|---|---|---|
| 3,868,608 | 2/1975 | Williams | 333/193 |
| 4,223,284 | * 9/1980 | Inoue et al. | 333/150 |
| 4,298,849 | 11/1981 | Arneson | 333/193 |
| 4,379,998 | 4/1983 | Shockley | 333/150 |
| 5,365,138 | 11/1994 | Saw et al. | 310/313 D |
| 5,790,000 | * 8/1998 | Dai et al. | 333/194 X |
| 5,793,266 | * 8/1998 | Allen et al. | 333/193 |
| 5,821,834 | * 10/1998 | Xu et al. | 333/193 |

FOREIGN PATENT DOCUMENTS

| | | | |
|---|---|---|---|
| 0 605 884 A1 | * 7/1994 | (EP) | 333/193 |
| 2 044 569 | 10/1980 | (GB) . | |
| 2 117 593 | 10/1983 | (GB) . | |
| 2 165 411 | 4/1986 | (GB) . | |

OTHER PUBLICATIONS

M.A. Sharif et al., "Coupled Resonator Filters With Differential Input and/or Differential Output", *1995 IEEE Ultrasonics Symposium*; Nov. 7–10, 1995; Seattle, WA, USA; pp. 67–70.*

B. Wall et al., "Balanced Driven Transversely Coupled Waveguide Resonator Filters", *1996 IEEE Ultrasonics Symposium*; Nov. 3–6, 1996; San Antonio, TX, USA; pp. 47–51.*

* cited by examiner

Primary Examiner—Benny Lee
Assistant Examiner—Barbara Summons
(74) Attorney, Agent, or Firm—Perman & Green, LLP (57) ABSTRACT

There is described an electro-acoustic device, comprising a piezo-electric substrate and a first transducer and second transducer supported by the substrate and each including a pair of interdigital transducer electrode arrays, the electrodes of the arrays being interleaved with each other. The first and second transducer are disposed opposing each other in a propagation direction of acoustic waves excited by the first and second transducers. The first transducer has a first electric signal associated with and existing across, and the second transducer has a second electrical signal associated with it which has a different phase from the first electrical signal. The first and second transducers are spaced apart such that substantially in-phase acoustic waves propagating in the substrate and incident on the first transducer in-phase with the first electric signal and on the second transducer in-phase with the second electrical signal. Preferably, the first and second transducers are spaced apart by an integer number of half acoustic wavelengths corresponding to an operating frequency of the device. This permits differential or balanced driving of the device. There is further disclosed examples of such a device utilised in transversely and in-line coupled resonator filters to provide balanced or differential inputs or outputs thereto, and to facilitate cascade connected coupled resonator filters having no ground loops.

1 Claim, 8 Drawing Sheets

ELECTRO-ACOUSTIC DEVICE WITH A VARIABLE ACOUSTIC WAVE VELOCITY PIEZOELECTRIC SUBSTRATE

FIELD OF INVENTION

The present invention relates to an electro-acoustic device, in particular but not exclusively, to a device for exciting Surface Acoustic Waves (SAW), or Surface Skimming Bulk Waves (SSBW).

BACKGROUND OF INVENTION

Typically, communication systems such as mobile telephones or cellular radio telephone systems require frequency band-pass filters having frequency ranges from tens of Megahertz to Gigahertz, and having fractional bandwidths covering a range from less than 0.01% to about 5.0%. The foregoing frequency ranges and bandwidths are suitable for both centre frequency and bandwidth for the intermediate frequency (IF) and radio frequency (RF) stages of such communication systems.

Well-known frequency filtering techniques for these frequency ranges are lumped LC filters, spiral or helical filters, dielectric filters and bulk acoustic wave filters. In addition to the foregoing there are also known electro-acoustic devices such as SAW coupled resonator filters, which have found particular applications in mobile communication systems since they are generally of lower volume and size, have better electrical performances, manufacturing uniformity and stability. Additionally, SAW devices can be manufactured to a substantially consistent standard, and hence there is less need to tune devices after fabrication. Comparison of coupled resonator filter techniques to other types of SAW band-pass filter techniques shows that the coupled resonator filter has a relatively low loss over its operating bandwidth with a high out of band rejection and small transition bandwidth.

Due to the low loss, high out of band rejection and small transition bandwidths typically associated with SAW coupled resonator filters including acoustic transversely coupled resonator filters and acoustic in-line coupled resonator filters, SAW coupled resonator filters are found to be particularly suitable for frequency band-pass filtering from narrow to moderate bandwidths. They are particularly suitable for miniaturised analogue and digital mobile communication systems as RF and IF filters.

Figure 1:
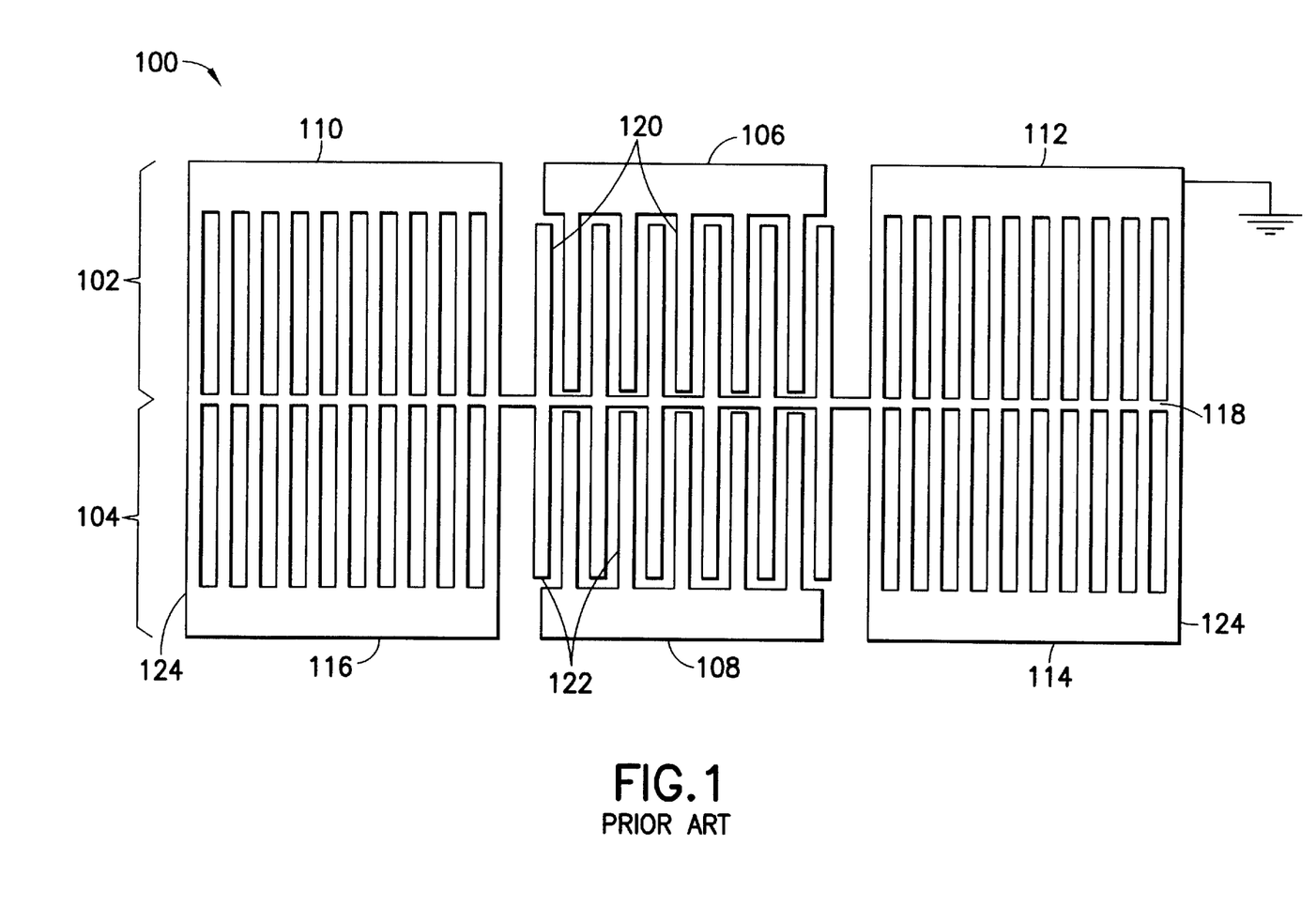
FIG. 1 shows a schematic diagram of a conventional transversely coupled resonator filter.

FIG. 1 shows a schematic diagram of a conventional 2-pole transversely coupled resonator filter (TCF) 100. The TCF is composed of two acoustic tracks 102, 104 which are disposed adjacent to each other. Each track consists of one inter-digital transducer (IDT) 106, 108 and two reflection gratings 110, 112, 114, 116 symmetrically disposed at each side of respective IDTs 106, 108. Each IDT 106, 108 comprises an array of transducer electrodes 120, 122 arranged in a comb-like fashion and interleaved with each other. A common bus bar 118 is coupled to the transducer electrodes on adjacent sides of the respective IDTs 106, 108. A common bus bar is advantageous in that adjacent acoustic tracks 102, 104 can be disposed closer together than if separate bus bars were used, which results in a stronger acoustically transverse coupling between adjacent tracks than for separate bus bars. Typically, the common bus bar 118 extends to the reflection gratings which in the example shown in FIG. 1 comprise earthed electrodes 124. When one or other of the IDTs 106, 108 is electrically excited an acoustic wave is excited within the respective acoustic track 102, 104. Due to the proximity of the acoustic tracks, an acoustic wave which is guided in a first acoustic track, 102 for example, is coupled into the second acoustic track 104 by virtue of an overlap of the guided wave profile tail in the first acoustic track, thereby exciting an acoustic wave in the second acoustic track. The acoustic wave in the second acoustic track then generates an appropriate electric signal in the IDT, 108 in this example, for the second acoustic track, and an electrical signal is output from the filter. The spaces between the IDT 106, 108 and each reflection grating can be covered with a conductive film or may be a free surface. Further details of transversely coupled resonator filters may be found in European Patent Application EP 0 100 503.

Figure 2:
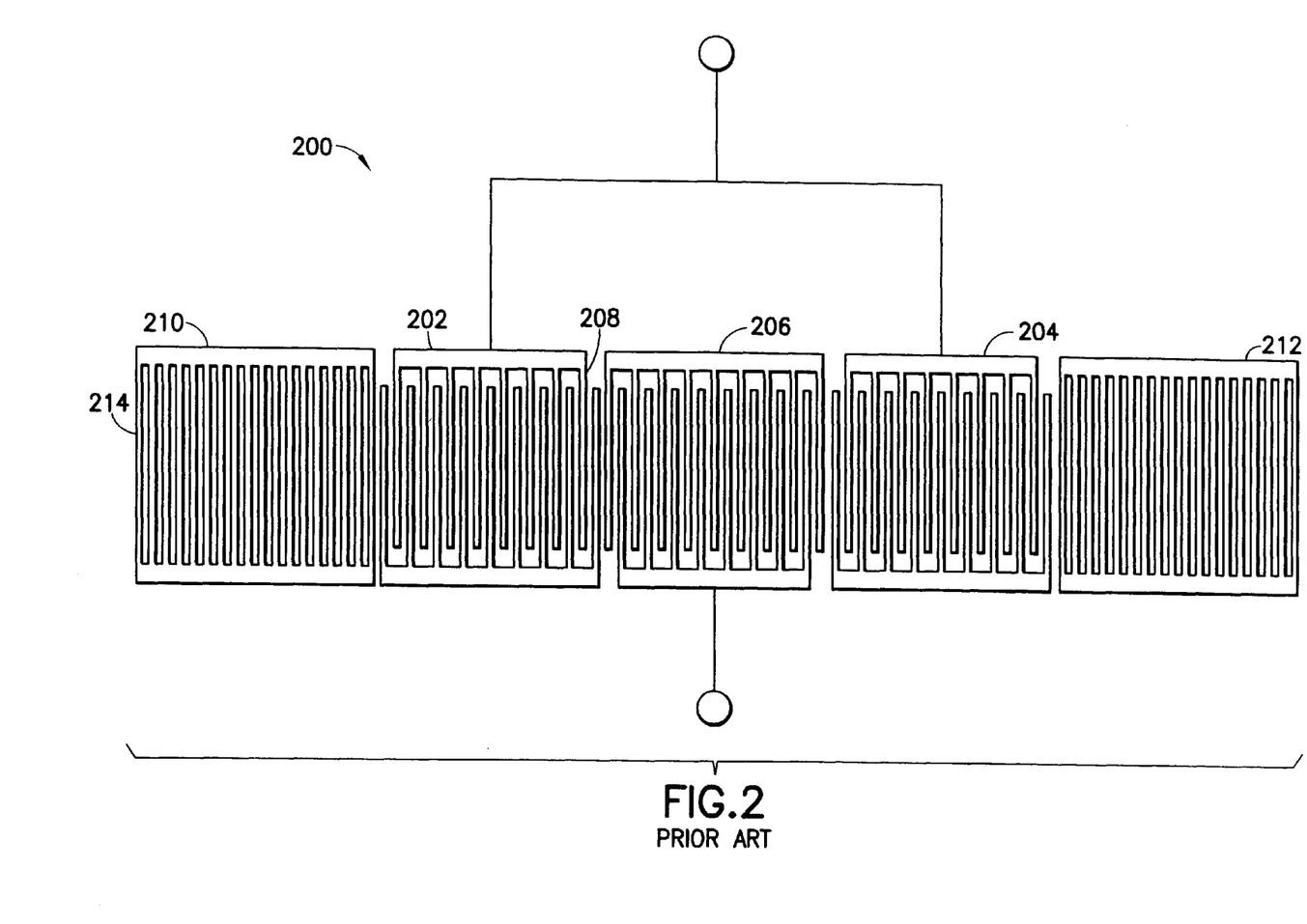
FIG. 2 shows a schematic diagram of a conventional acoustic three IDT in-line coupled resonator filter.

FIG. 2 shows a typical in-line coupled resonator filter 200. The in-line coupled resonator filter shown in FIG. 2 consists of three IDTs 202, 204 and 206 and two reflection gratings 210 and 212 collinearly positioned with respect to each other. The two outer IDTs 202 and 204 are parallel-connected and IDT 206 is disposed between them. The whole system shown in FIG. 2, including the reflection gratings 210 and 212 comprises a cavity resonant system having two electric ports. A first electric port is formed by IDTs 202 and 204 and a second electric port is formed by IDT 206. As discussed with reference to FIG. 1 each of the IDTs 202, 204, 206 consist of arrays of interleaved transducer electrodes 208. The reflection gratings comprise earthed electrodes 214. In operation, when one electric port of the in-line coupled resonator filter is driven by an applied voltage acoustic cavity modes are excited within the resonant system and the other electric port couples to these acoustic modes to produce an electric output signal.

Both the conventional coupled resonator filters described above are suitable for only unbalanced driving and loading at their input and output ports. Thus, they are only capable of being directly coupled to devices having unbalanced inputs or outputs. Thus, they are not particularly suitable for a number of applications, for example, an IF band-pass filter coupled to a balanced mixer. For applications where the conventional coupled resonator filter is to be coupled to balanced inputs or outputs an appropriate balanced-unbalanced (BALUN) transition is required. Such transitions are typically lossy and furthermore take up space either on a circuit board upon which they are typically etched or by virtue of the lumped element components comprising the BALUN. Additionally, when more than one coupled resonator filters are cascaded together to form multi-track, multi-pole filters, the necessary ground connections between respective tracks of the cascaded filters result in cross-talk which seriously degrades the performance of such multi-pole filters. Such degradation in performance is particularly noticeable in the out of band regions of such filters. Furthermore, having to provide ground connections between tracks of multi-track devices makes the layout of the device more complex. In many cases the connections can only be performed by using bonding wires. Such bonding wires or flying leads introduce parasitic electrical components into the electrical characteristics of the device and thereby further degrade the device's performance.

BRIEF SUMMARY OF THE INVENTION

In a first aspect of the invention there is provided an electro-acoustic device, comprising a piezo-electric substrate, a first transducer supported by the substrate and including a pair of interdigital transducer electrode arrays, the electrodes of the arrays being interleaved with each other, a second transducer supported by the substrate and including a pair of interdigital transducer electrode arrays, the electrodes of the arrays being interleaved with each other, the first transducer being associated with a first electrical signal and the second transducer being associated with a second electrical signal having a different phase from the first electrical signal, wherein the first and second transducer are disposed opposing each other in a propagation direction of acoustic waves excitable by the first and second transducers, and the first and second transducers are spaced apart such that substantially in phase acoustic waves propagating along the substrate are incident on the first transducer in phase with the first electrical signal and on the second transducer in phase with the second electrical signal.

This has the advantage that out of phase signals may be input or output from a device such that the acoustic waves generated or received by respective transducers are in-phase.

Preferably, the first and second electric signals are $(2N-1)\pi$ out of phase and the first and second transducers are spaced apart by an odd integer number of half acoustic wavelengths corresponding to an operating frequency of the device, where N is an integer.

Particularly, an outer electrode of one of the pairs of electrode arrays of the first transducer is disposed confronting an outer electrode of the second transducer of a corresponding one of the pair of electrode arrays of the second transducer.

This has an advantage in that balanced signals may be input to or output from such a device, or differential inputs be provided, by coupling respective input or output terminals to those electrode arrays whose outer electrodes of corresponding ones of the pairs of electrode arrays are disposed relative to each other by an integer number of half acoustic wavelengths. Thus, such a electro-acoustic device can be directly coupled to the input or output of a balanced or differential device as appropriate. Additionally, this is a particularly simple and straight forward way of ensuring that the respective outer electrodes are disposed relative to each other for exciting acoustic waves which are in phase when corresponding to respective electrical signals which are $(2N-1)\pi$ out of phase.

Optionally, a conductive film may be disposed between the first and second transducers, which has the effect of altering the acoustic wave velocity under the conductive film which results in differing distances for a given separation of an integer number of half wavelengths. Suitably, the electrode arrays in the first and second transducers corresponding to the outer electrodes are electrically coupled to ground.

Preferably the electrode arrays of the first and second transducers corresponding to the outer electrodes are electrically coupled together via a common bus bar. This reduces the complexity of the layout. Additionally, there is no need for ground loops between respective transducers which reduces losses and cross-talking in the device.

Respective outer electrodes of corresponding ones of the pairs of electrode arrays may be formed integral with each other for forming a single wide electrode. This has an advantage in that the whole electrode is at the same potential.

Typically, an electro-acoustic device as hereinbefore described is integral with either a transversely or in-line coupled resonator filter to form a balanced or differential terminal for the transversely or in-line coupled resonator filter respectively. This has the advantage in that such coupled resonator filters can be directly coupled to the input or output of devices having balance or differential inputs or outputs. This obviates the need for balanced or unbalanced transitions and acts to further reduce losses in such circuits.

Advantageously, the electro-acoustic device excites surface acoustic wave, leaky surface acoustic waves or surface skimming bulk waves. These are particularly well-known and well understood wave mechanisms and thus appropriate devices can be relatively easily designed and fabricated.

In a second aspect of the invention there is provided a first transversely coupled resonator filter, comprising a first device as described above integral therewith for forming an output terminal thereof, and a second transversely coupled resonator filter comprising a second device as described above integral therewith for forming an output terminal thereof, wherein the first and second devices are operably coupled via the first and second devices for forming a composite transversely coupled resonator filter having a balanced coupling between the first and second transversely coupled filters.

This has an advantage in that there is no need for ground loop connections therefore suppressing cross-talk and making the layout less complex. Additionally, it reduces the need for bonding wires further reducing the complexity of the layout and also losses inherently due to the parasitic effect of the bond wires.

In a third aspect of the invention there is provided a first in-line coupled resonator filter, comprising a first device as described above integral therewith for forming an output terminal thereof, and a second in-line coupled resonator filter comprising a second device as described above integral therewith for forming an input terminal thereof, wherein the first and second devices are operably coupled via the first and second devices for forming a composite in-line coupled resonator filter having a balanced coupling between the first and second in-line coupled resonator filters.

Again, such a configuration obviates the need for ground connections and also results in less complex layout.

In a fourth aspect of the invention there is provided a first in-line coupled resonator filter, comprising a first device as described above integral therewith for forming an input terminal thereof, and a second in-line coupled resonator filter, comprising a second device as described above integral therewith for forming an output terminal thereof, wherein the first and second in-line coupled resonator filters further comprise interdigital transducers disposed either side of the first and second devices respectively, said interdigital transducers of the first in-line coupled resonator filter being operably coupled to corresponding interdigital transducers of the second in-line coupled resonator filter for forming a composite in-line coupled resonator filter for forming differential or balanced inputs and/or outputs.

DETAILED DESCRIPTION OF EMBODIMENTS OF THE INVENTION

Specific embodiments of the invention will now be described, by way of example only and with reference to the following drawings.

Although the specific embodiments disclosed below are described with reference to balanced input or output signals, the claimed invention is not so limited and encompasses differentially driven and arbitrarily phased signals.

Figure 3A:
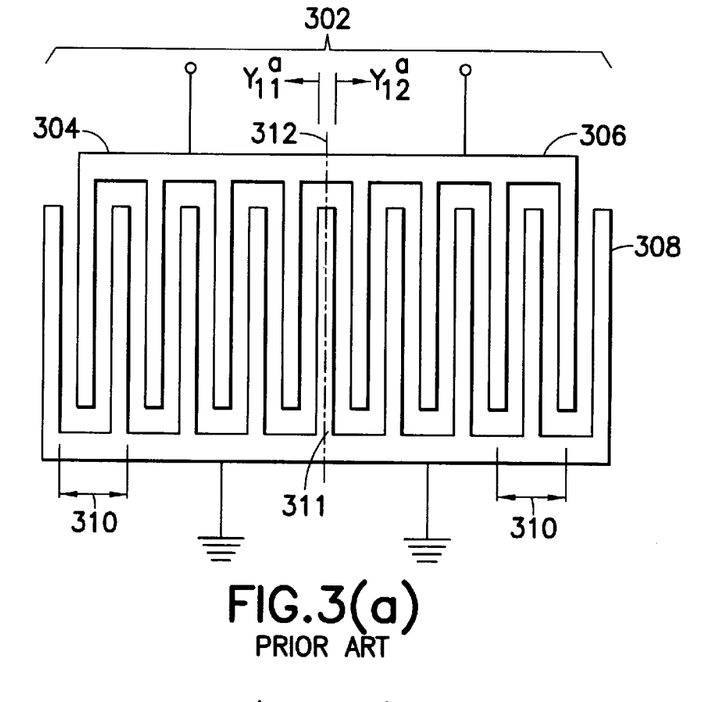
FIG. 3a shows a schematic of a conventional IDT described as a two electric port system.

FIG. 3a shows a conventional IDT shown as a two electric port system. In principle a conventional IDT 302 comprising 4N+1 (N is a positive integer) fingers or electrode transducers 308 (forming 2N periods 310) can be considered to comprise a cascade of two separate IDTs 304, 306. Each separate IDT 304, 306 is 2N+1 electrode fingers long and they have a zero space (shown as dotted line 312) between them. The two electric port system can be expressed by a 2×2 admittance matrix $[Y_{ij}^a]$.

The current $I_1^a$, $I_2^a$ flowing in respective separate IDTs 304, 306 can be given by the following equations;

$$I_1^a = Y_{11}^a V_1^a + Y_{12}^a V_2^a \quad (1)$$

$$I_2^a = Y_{21}^a V_1^a + Y_{22}^a V_2^a \quad (2)$$

Where $V_1^a$ and $V_2^a$ are the voltages across respective IDTs 304, 306 and the admittances Y are in accordance with usual notation, such that $Y_{11}^a$ and $Y_{22}^a$ are self admittances of respective transducers 304, 306, and $Y_{12}^a$ and $Y_{21}^a$ are mutual admittances of respective transducers 304, 306.

For unbalanced driving or receiving, the following electrical condition applies, $$I^a = I_1^a + I_2^a \text{ and } V^a = V_1^a = V_2^a \quad (3)$$

Therefore the total admittance of the combined IDT is given by $$Y_T^a = \frac{I^a}{V^a} = (Y_{11}^a + Y_{12}^a + Y_{21}^a + Y_{22}^a) = 2(Y_{11}^a + Y_{12}^a) \quad (4)$$

since due to symmetry $Y_{11}^a = Y_{22}^a$, and $Y_{12}^a = Y_{21}^a$.

Figure 3B:
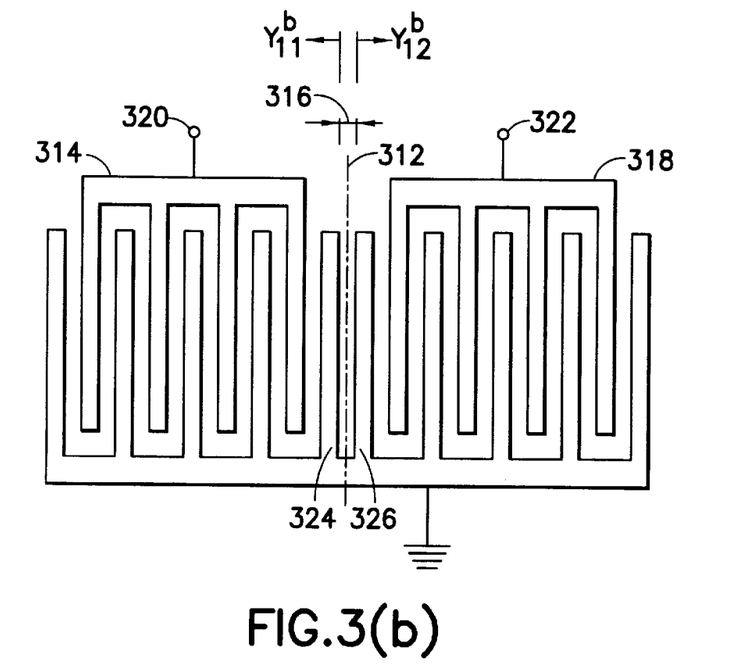
FIG. 3b shows a schematic of a split-IDT structure described as a two electric port system.

FIG. 3b shows the conventional IDT 302 as described with reference to FIG. 3a having the two IDTs 304, 306 separated by a space 316 thereby forming two separate IDTs 314 and 318. Conceptually, the single centre electrode 311 of FIG. 3a can be considered to have been split into two spaced apart electrodes 324 and 326. Hence, this type of configuration has been termed a "split" IDT. The separation 316 between the two electrodes 324, 326 of respective IDTs 314, 318 is an odd integer number of half acoustic wavelengths corresponding to an operating frequency of the device, (typically the centre frequency of the device). That is to say, there is a π phase difference between electrodes 324 and 326. Optionally, this separation may be described in terms of transducer periods in which case the separation 316 is an odd integer number of half periods. Algebraically the separation 316 can be given by, $(N+\frac{1}{2})\lambda_0$ or $(N+\frac{1}{2})$ periods, where $\lambda_0$ is an acoustic wavelength at an operating frequency of the device and N is a positive integer. Typically, the separation is measured from centre to centre of adjacent electrodes. Optionally, the separation 316 can be covered by a conductive film such as a metal film, or may remain a free surface. In such a configuration the two separate electrodes 324 and 326 form a single wide electrode, which effectively separates the IDTs 314 and 318 by an integer number of half acoustic wavelengths.

The two port IDT shown in FIG. 3(b) can also be described by a 2×2 admittance matrix, $[Y_{ij}^b]$. The current $I_1^b$, $I_2^b$ flowing in respective separate IDTs 314, 318 is given by the following equations;

$$I_1^b = Y_{11}^b V_1^b + Y_{12}^b V_2^b \quad (5)$$

$$I_2^b = Y_{21}^b V_1^b + Y_{22}^b V_2^b \quad (6)$$

Where $V_1^b$ and $V_2^b$ are the voltages across respective IDTs 314, 318 and the admittances Y are in accordance with usual notation such that $Y_{11}^b$ and $Y_{22}^b$ are self admittances of respective transducers 314, 318 and $Y_{12}^b$ and $Y_{21}^b$ are mutual admittances of respective transducers 314, 318.

Because separate IDTs 314, 318 can be considered identical to 304, 306 the self admittance $Y_{11}^b = Y_{11}^a$, and the mutual admittance, $Y_{12}^b = -Y_{12}^a$ due to the π phase shift between the adjacent electrodes 324, 326. When the split IDT is used differential driving IDT, or as a balanced terminal, it has an electrical terminal condition given by $I^b = I_1^b = -I_2^b$ and $V^b = V_1^b - V_2^b$.

Thus the total admittance of a split IDT used as a differentially driving IDT is, $$Y_T^b = \frac{I^b}{V^b} = \frac{1}{2}(Y_{11}^b - Y_{12}^b) = \frac{1}{2}(Y_{11}^a + Y_{12}^a) = \frac{1}{4}Y_T^a$$

Thus a split IDT working as a differential driving IDT has an admittance equal to a quarter of the admittance of a conventional IDT with same number and configuration.

Thus the split IDT comprising separate IDTs 314 and 318 can be used as an IDT having a balanced input or output terminals 320, 322, with an admittance which is proportional to the admittance of a conventional IDT. In contrast to a conventional IDT, the so-called split IDT can be operated in a balanced manner.

Although a general principle in accordance with the invention has been described above with reference to balanced inputs and outputs, the present invention is not limited to balanced operation. If, for example, the IDTs 314, 318 were of different lengths or non-symmetric in some other way such that their respective admittances were different, then they would operate as differential un-balanced inputs or outputs. The present invention is applicable to non-symmetric differential ports as well as balanced ports. Additionally, embodiments of the present invention are also suitable for differential inputs.

Figure 4:
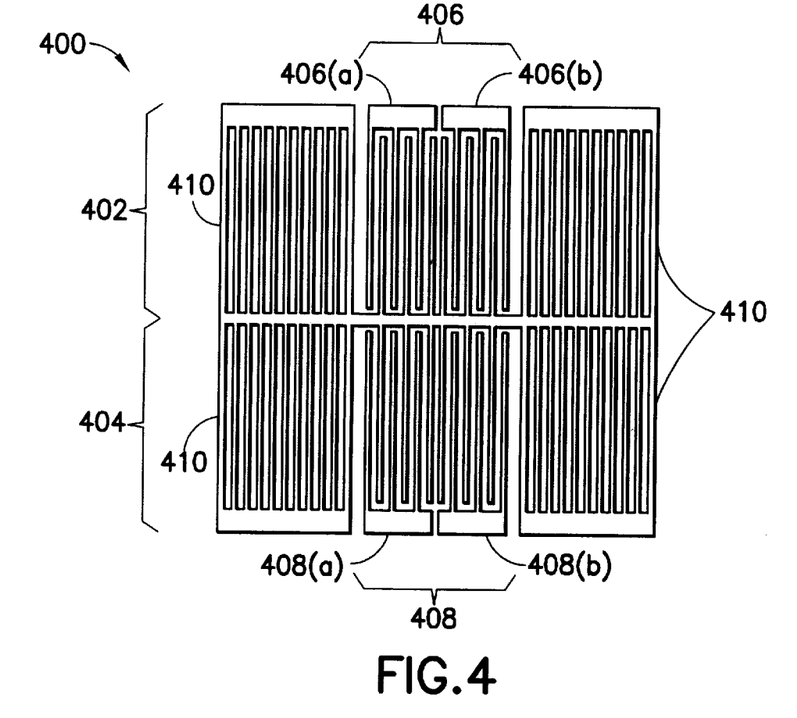
FIG. 4 shows a schematic of a two pole transversely coupled resonator filter having both balanced input and balanced outputs.

FIG. 4 shows a schematic diagram of a two-pole transversely coupled resonator filter 400 having both balanced input and balanced outputs in accordance with the invention.

The configuration in FIG. 4 comprises two adjacent acoustic channels 402, 404 which are acoustically transversely coupled to each other. Each channel consists of an IDT 406, 408 and two reflection gratings 410 positioned at either side of respective IDTs 406, 408. Instead of the IDTs 406, 408 comprising single uniform IDTs as in a conventional structure, a split IDT structure in accordance with the present invention is utilised. Thus, the IDTs 406, 408 comprise separate transducers 406(a) 406(b) and 408(a) 408(b) spaced apart by an integer number of half acoustic wavelengths. Due to the structural symmetry inherent in the device shown in FIG. 4, the central bus bar and the transducer electrodes of the IDTs 406, 408 coupled to the central bus bar are forced to be at the same potential, for example ground. Thus, in principle this configuration does not require any coupling to a common reference voltage such as ground connections. The acoustically transversely coupled filter 400 operates in a conventional manner in that the reflection gratings 410 and the IDTs 406, 408 both use solid fingers having an appropriate reflectivity for reflecting acoustic waves propagating underneath them and through a suitable piezo electric substrate. However, any suitable reflecting finger could be used. This in-line structure forms a distributed feed back reflection cavity for each track 402, 404. Acoustic waves generated by respective split IDTs 406(a), 406(b) and 408(a), 408(b) are reflected back and forth within respective cavity tracks 402, 404 and form acoustic cavity wave guide modes. These modes are coupled to adjacent channels by mode profile tails penetrating into the adjacent channels. That is to say, if IDT 406 is excited by an electrical signal an acoustic wave guide mode is formed in acoustic track 402 which couples into acoustic track 404. The split IDT 408 in the lower acoustic channel 404 transforms the acoustic cavity wave guide mode propagating in acoustic track 404 into a balanced output signal by virtue of respective IDTs 408(a), 408(b) which comprise IDT 408. The frequency filtering of this device is performed in the same manner as for conventional acoustically transversely coupled resonator filters.

Figure 5:
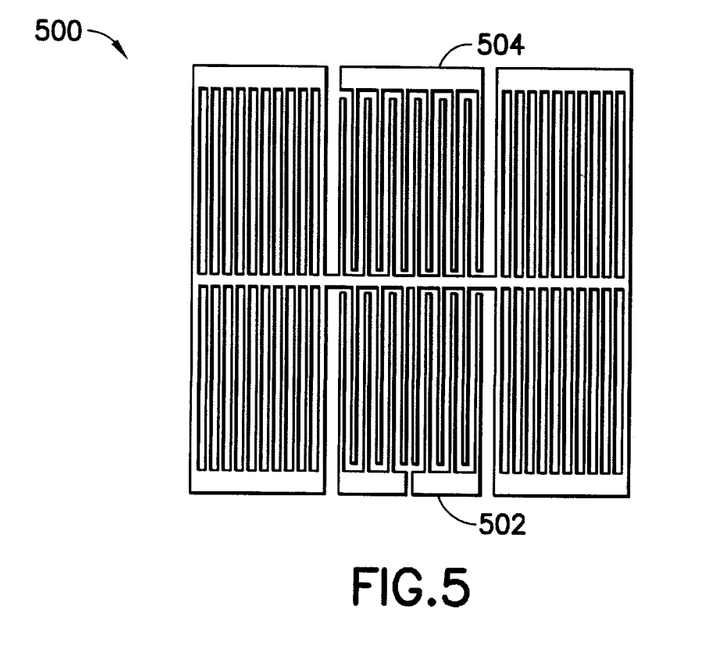
FIG. 5 shows a schematic of a two pole transversely coupled resonator filter having a terminal condition transformable from unbalanced to balanced or vice versa.

FIG. 5 shows a schematic diagram of a two pole acoustically transversely coupled resonator filter 500 having just one of the IDTs 502 split, thereby providing a filter which can act as an unbalanced to balanced or balanced to unbalanced transition. The unsplit transducer 504 provides the unbalanced terminal.

Figure 6:
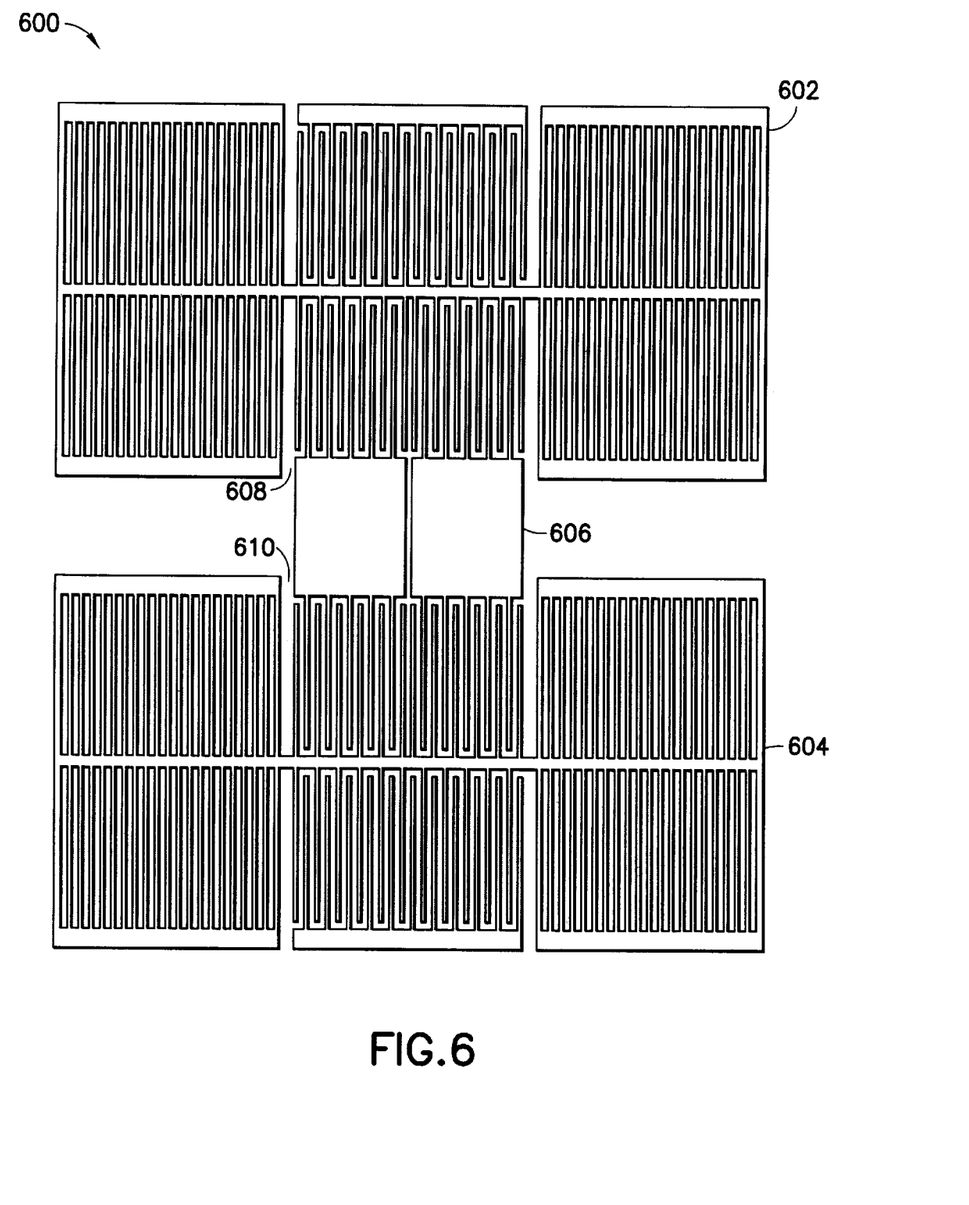
FIG. 6 shows a schematic diagram of a four pole transversely coupled resonator filter having a balanced electrical coupling between respective transversely coupled resonator filters.

FIG. 6 shows a four pole acoustically transversely coupled resonator filter structure 600 comprising two two-pole acoustically transversely coupled resonator filters 602, 604 each operating to form cavity modes in a conventional manner. The two transversely coupled resonator filters 602, 604 are electrically coupled via a balanced coupling 606. This is achieved by having the output IDT 608 of the upper acoustically transversely coupled resonator filter 602 formed as a split IDT in a manner in accordance with the present invention. In a corresponding fashion the input IDT 610 of the lower acoustically transversely coupled resonator filter 604 is formed in a manner in accordance with the present invention. Thus a balanced coupling 606 may be provided between the respective balanced outputs 608 and input 610 of respective acoustically transversely coupled resonator filters 602, 604. As can be seen from FIG. 6, although there is a cascade of acoustically transversely coupled resonator filters there is no need for common reference voltage connections such as ground loops or complex ground connections. Thus, the degradation and parasitics typically associated with such ground loop connections can be avoided. This greatly reduces the cross-tall typically caused by common ground loop connections between input and output terminals of cascaded devices, and results in improved operating characteristics and lower losses for the cascaded device 600, relative to cascaded devices using conventional transversely coupled resonator filters. Additionally, bonding wires are not necessary for the device 600 which helps to reduce spurious responses or disturbances.

Figure 7A:
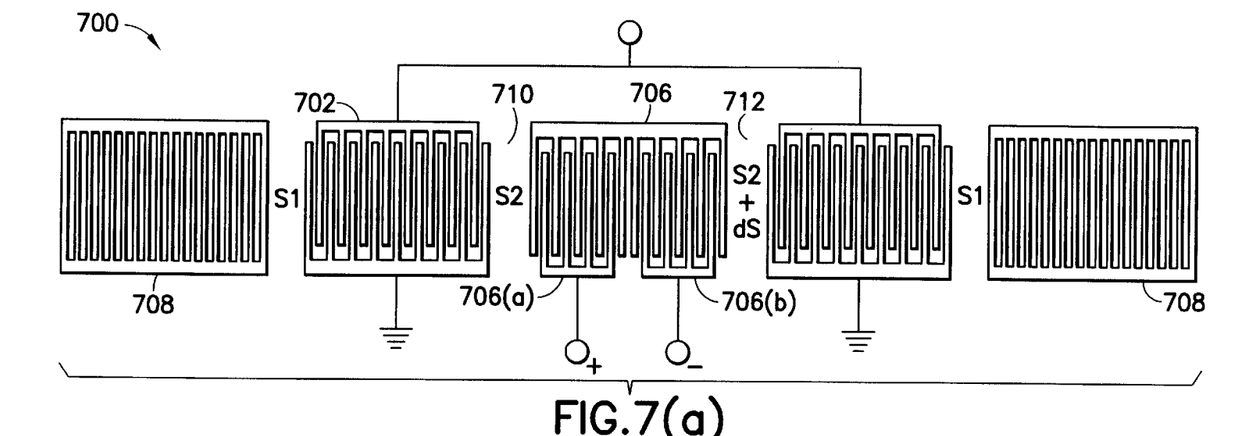
FIG. 7a and 7b show schematic diagrams of two embodiments of two pole in-line (longitudinal) coupled resonator filters providing transitions from unbalanced to balanced, or vice versa, coupling.
Figure 7B:
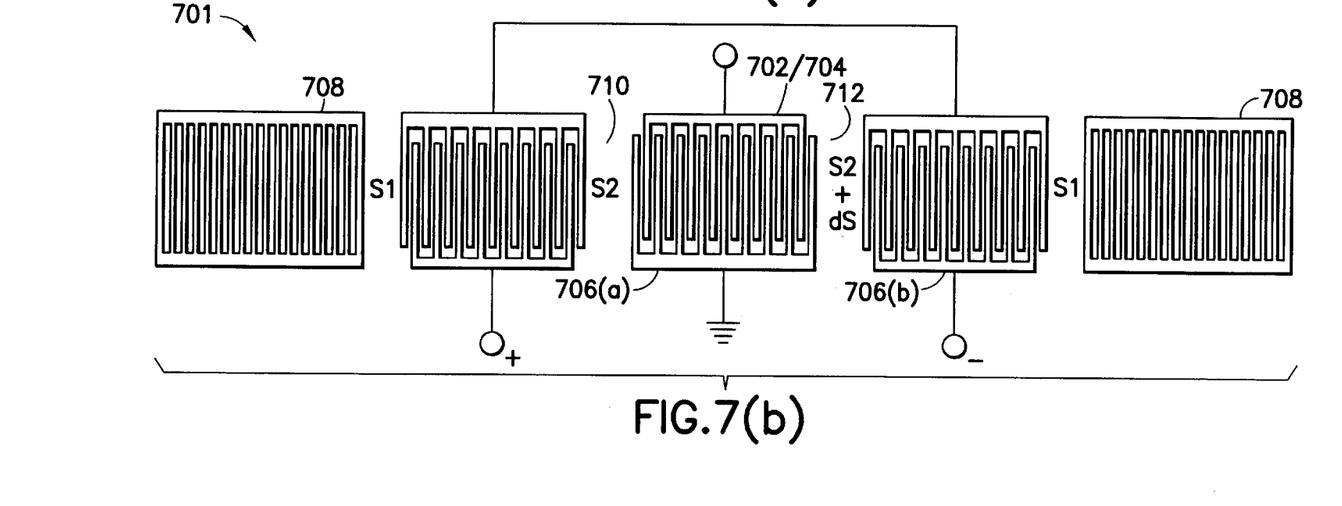

FIG. 7 shows schematic diagrams of two embodiments of acoustic in-line coupled resonator filters 700 and 701 comprising two poles. Filter 700 comprises two reflection gratings 708 fabricated from conductive (metal) film strips or grooves, two IDTs 702, 704 and a split IDT 706 comprising transducer electrode fingers. In the filter 700, two conventional IDTs 702, 704 are placed at either side of a split IDT 706 and are coupled together in parallel for use as an unbalanced port. The split IDT 706 comprising transducers 706(a), 706(b) acts as a balanced port. IDT 702 is spaced apart 710 from IDT 706 (as by a distance S2.), and IDT 704 is spaced apart 712 from IDT 706(b) by a distance (S2+dS). In FIG. 7(b) the reflection gratings 708 are spaced from the transducers 706(a), 706(b) by a distance S1. In FIG. 7(a) the reflection gratings 708 are spaced from the IDTs 702,704 by a distance S1. The in-line structure serves as an acoustic distributed feedback reflection cavity in substantially the same manner as a acoustically transversely coupled resonator filter described before. However, with the acoustic in-line coupled resonator it is longitudinal cavity modes which couple to the respective IDTs 702, 704, 706.

In-line coupled resonator filter 700 may be configured to have either balanced input or output. An electrical signal applied to the unbalanced port comprising IDTs 702 and 704 generates acoustic waves within the cavity formed by the reflection gratings 708. It should be noted that IDTs 702 and 704 should be spaced apart such that acoustic waves respectively generated thereby are in phase. The difference in spacing dS, between 702, 706(a) and 704, 706(b) is adjusted to achieve this phase coherence. The longitudinal cavity mode set up by excited IDTs 702 and 704 couples to split IDT 706 comprising separate transducers 706(a), 706(b) in accordance with the invention. The acoustic wave cavity mode generates electrical signals on transducers 706(a), 706(b) which are coupled out of the filter as balanced signals. Optionally, the input and output ports may be reversed to provide balanced input and unbalanced output.

FIG. 7b shows a filter 701 comprising similar elements to the device 700 shown in FIG. 7a, but arranged differently. Like numerals are used to denote like parts. Filter 701 functions in a similar manner to filter 700, but the split IDT comprises IDTs 706(a) and 706(b) disposed at respective sides of a central unbalanced terminal comprising combined IDTs 702/704. Again, the difference in spacing dS is selected to provide coherent acoustic wave generation from IDTs 706(a), 706(b) and 702/704. The two IDTs 706(a), 706(b) which form the split transducer are spaced an integer number of half wavelengths apart plus the extra spacing dS.

Device 700 and 701 may be utilised as basic cells to build multi-pole filters which can be adapted to provide balanced or unbalanced input or output terminals if required.

Figure 10A:
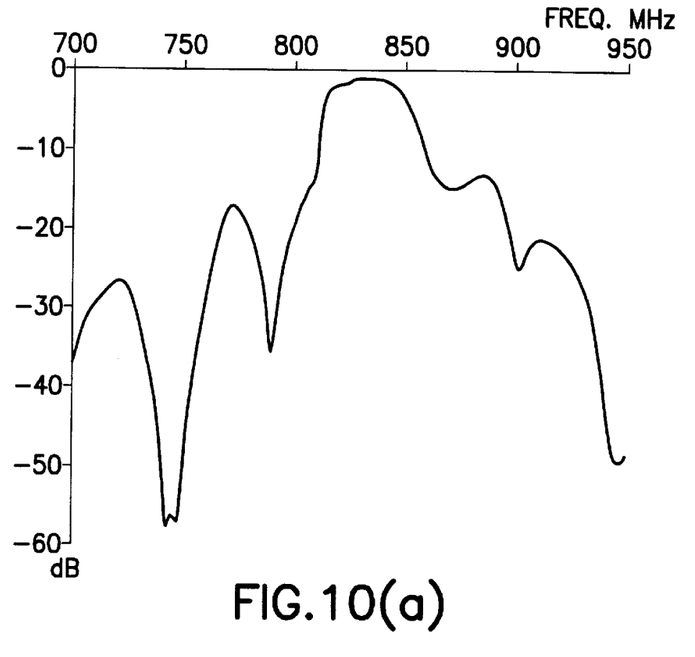
FIGS. 10a and 10b show signal transfer characteristics for devices in accordance with respective embodiments shown in FIGS. 7a and 7b.
Figure 10B:
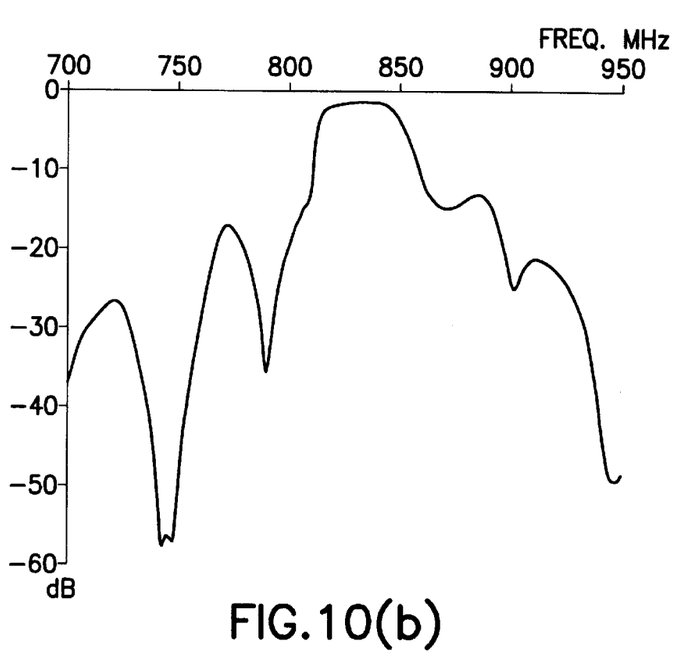

FIGS. 10a and 10b respectively show the signal transfer performance of a filter designed in accordance with the present invention and configured in accordance with FIG. 7a and 7b. In the examples, dS is a half acoustic wavelength for the device the source resistance is 50 Ω, load resistance is 200 Ω, and the devices are built on 64°YX-LiNbO$_3$ substrate material.

Figure 8:
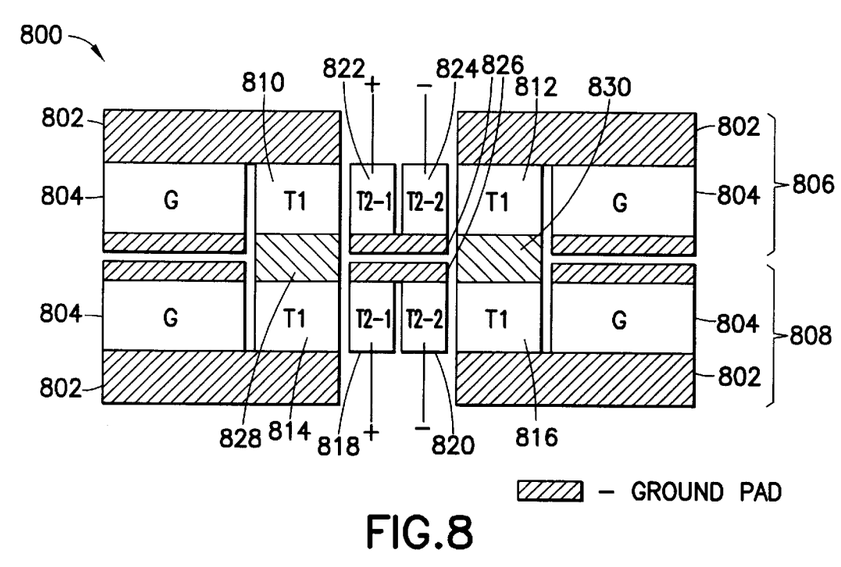
FIG. 8 shows a schematic of a four pole three IDT in-line coupled resonator filter having balanced input and balanced output constructed utilising split IDTs.

FIG. 8 shows a four pole filter 800 comprising two acoustic in-line coupled resonator filters respectively formed in acoustic tracks 806, 808 and having both balanced input and output terminals. Reflection gratings 804 (G) are coupled to corresponding IDTs 810, 812, 814, 816 (commonly referred to as T1 in FIG. 8) via ground pads 802, although it is not necessary to do so. IDTs 810, 814 and 812, 816 disposed adjacent each other in respective tracks are coupled together via conductors 828, 830. The balanced ports are formed by IDTs 818, 820 and 822, 824 and have common grounds 826. The "+" and "−" ports formed by the IDTs 818, 820, 822, 824 are labeled in FIG. 8 as T2-1 and T2-2, respectively.

The balanced ports are formed in a manner in accordance with the invention. An electrical signal exciting a balanced port, e.g. 822, 824 causes an acoustic wave cavity mode to be set up in the in-line coupled resonator in track 806. IDTs 810 and 812 couple to the cavity mode and form electrical signals which are coupled to IDTs 814 and 816 respectively via conductors 828, 830. IDTs 814, 816 then generate acoustic wave cavity modes in track 808 which couple to IDTs 818, 820. IDTs 818, 820 generate electrical signals responsive to the cavity mode and output a balanced electrical signal.

Figure 9:
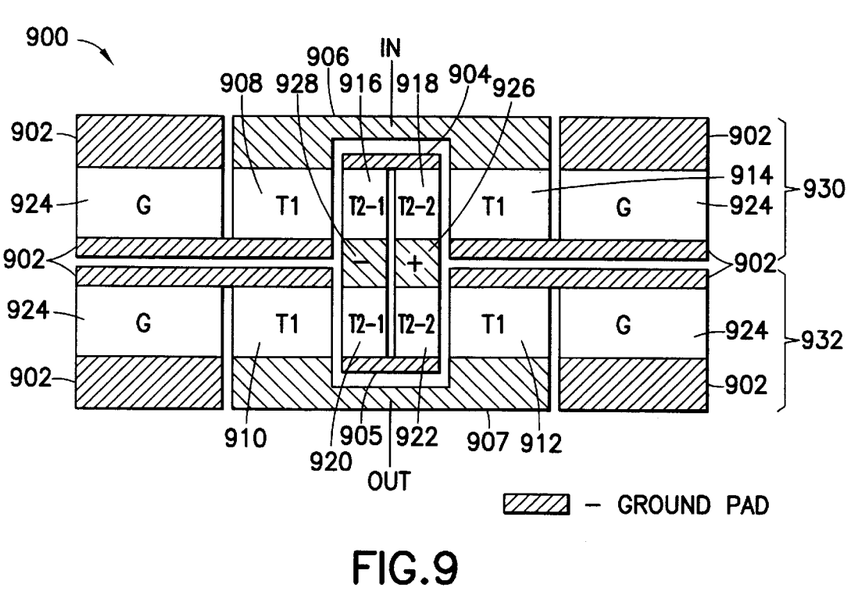
FIG. 9 shows a four pole three IDT in-line coupled resonator filter constructed by the use of split IDTs as coupling IDTs.

Additionally, FIG. 9 shows a four pole in-line coupled resonator filter comprising two two-pole acoustic in-line coupled resonator filters, cascade coupled through a split IDT in a balanced manner. Each acoustic track 930, 932 respectively comprises a two-pole acoustic in-line filter. At each end of respective filters are reflection gratings (G) 924 coupled to ground via pads 902. Between the gratings 924, there are disposed IDTs 908, 914 and 910, 912 respectively. IDTs 908 and 914, and IDTs 910 and 912 are coupled to each other by conductors 906 and 907 respectively. Between IDTs 908, 914 and 910, 912 are respectively disposed balanced IDTs 916, 918 and 920, 922. The balanced IDTs are formed as in accordance with the present invention, and comprise common bus bars 904, 905. IDTs 916, 918, 920 and 922 are coupled together via respective balanced terminals 926, 928.

In operation device 900 has input to it an unbalanced electrical signal via IDTs 908, 914. This sets up an acoustic wave cavity mode in track 930 which couples to balanced IDTs 916, 918. These form balanced electrical signals which are coupled via conductors 926, 928 to balanced IDTs 922, 920. The electrical signals on IDTs 920, 922 form acoustic wave cavity modes in track 932 which couple to IDTs 910, 912 to form an unbalanced electrical output signal. The configuration shown in FIG. 9 is different from the conventional four pole in-line resonator filter in that the reference voltage or ground loops for the input and output terminals can be completely disconnected. This greatly reduces crosstall caused by common reference voltage or ground loop connections between input and output terminals and further reduces the number of bonding wires that are necessary for such a device. Thus, spurious disturbances and parasitics are reduced.

In view of the foregoing description it will be evident to a person skilled in the art that various modifications may be made within the scope of the invention. For example, the split IDT does not only form a balanced terminal, but may be configured to form a differential terminal which is un-balanced. Although the term split IDT has been used to refer to balanced or differential IDTs, this nomenclature is only used as a matter of convenience. It is evident that the balanced differential terminal does not have to be "split" but may comprise physically separate IDTs without a common bus bar. Throughout the description embodiments in accordance with the invention have been described in which the confronting outer electrodes of the balanced or differential IDT are reference voltage or ground electrodes. This need not be the case, and the confronting outer electrodes could be coupled to signal voltages as opposed to a reference voltage, i.e. to respective signals of balanced or differential lines.

Optionally, the two parts of a balanced terminal may be separated by other IDTs, providing that the two parts are separated by an integer number of half acoustic wavelengths.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What We claim is:

1. An electro-acoustic device comprising:
   a piezo-electric substrate, wherein the piezo-electric substrate further comprises a variable acoustic wave velocity substrate;
   a first transducer supported by the substrate and including a pair of interdigital transducer electrode arrays, the electrodes of the arrays being interleaved with each other;
   a second transducer supported by the substrate and including a pair of interdigital transducer electrode arrays, the electrodes of the arrays being interleaved with each other;
   the first transducer being associated with a first electrical signal and the second transducer being associated with a second electrical signal having a different phase from the first electrical signal, wherein the first and second transducers are disposed opposing each other in a propagation direction of acoustic waves excitable by the first and second transducers, and the first and second transducers are spaced apart such that substantially in phase acoustic waves propagating along the substrate are incident on the first transducer in phase with the first electrical signal and on the second transducer in phase with the second electrical signal, wherein electrode arrays of the first and second transducers corresponding to the outer electrodes of the first and second transducers are electrically coupled to ground and said outer electrodes being electrically coupled together in a manner so as to be integral with each other thereby forming a single electrode, said single electrode being broader than said interdigital transducer electrodes.

* * * * *